(12) United States Patent
Takaishi

(10) Patent No.: US 7,245,004 B2
(45) Date of Patent: Jul. 17, 2007

(54) SEMICONDUCTOR DEVICE

(75) Inventor: Masaru Takaishi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 11/262,967

(22) Filed: Nov. 1, 2005

(65) Prior Publication Data

US 2006/0076674 A1   Apr. 13, 2006

Related U.S. Application Data

(63) Continuation-in-part of application No. 10/813,008, filed on Mar. 31, 2004, now abandoned.

(30) Foreign Application Priority Data

May 20, 2003   (JP) ............................. 2003-142393

(51) Int. Cl.
*H01L 23/495* (2006.01)
(52) U.S. Cl. ................ 257/675; 257/796; 257/E23.104
(58) Field of Classification Search ................ 257/666, 257/675, 735, 796, 706, 707, 688, 704, 709–712, 257/714, 717, 718–723, 776, 713; 361/688, 361/704, 707, 709–712, 714, 717–723
See application file for complete search history.

(56) References Cited

U.S. PATENT DOCUMENTS

| | | | |
|---|---|---|---|
| 5,175,612 A * | 12/1992 | Long et al. .................. | 257/667 |
| 5,483,098 A | 1/1996 | Joiner, Jr. | |
| 5,581,118 A | 12/1996 | Mays | |
| 5,693,984 A | 12/1997 | Ootsuki | |
| 6,215,176 B1 | 4/2001 | Huang | |
| 6,249,041 B1 * | 6/2001 | Kasem et al. ................ | 257/666 |
| 6,479,888 B1 | 11/2002 | Hirashima et al. | |
| 6,650,004 B1 | 11/2003 | Horie et al. | |
| 2002/0014704 A1 | 2/2002 | Horie | |

FOREIGN PATENT DOCUMENTS

| | | |
|---|---|---|
| JP | 59-207645 | 11/1984 |
| JP | 60-160639 | 8/1985 |
| JP | 62-169450 | 7/1987 |
| JP | 04-174547 | 6/1992 |
| JP | 5-67001 | 9/1993 |
| JP | 6-21276 | 1/1994 |

(Continued)

*Primary Examiner*—B. William Baumeister
*Assistant Examiner*—Dana Farahani
(74) *Attorney, Agent, or Firm*—Rabin & Berdo PC

(57) ABSTRACT

A semiconductor device mountable on a wiring board with the bottom surface being opposed to the wiring board including a semiconductor chip; a mold resin encapsulating the semiconductor chip; a first heat spreader joined to the semiconductor chip on the bottom surface side with both ends protruding from the mold resin, the first heat spreader being capable of being joined to the wiring board at both ends; and a second heat spreader joined to the semiconductor chip on a top surface side with both ends thereof protruding from the mold resin, the second heat spreader being capable of being joined to the wiring board at both ends. One of the heat spreaders is a lead frame electrically connected to the semiconductor chip. The first and second heat spreaders are substantially entirely covered with the mold resin on the bottom surface side and the top surface side, respectively.

6 Claims, 8 Drawing Sheets

FOREIGN PATENT DOCUMENTS

| | | |
|---|---|---|
| JP | 6-53390 | 2/1994 |
| JP | 7-22540 | 1/1995 |
| JP | 7-231065 | 8/1995 |
| JP | 8-46100 | 2/1996 |
| JP | 8-46104 | 2/1996 |
| JP | 8-298302 | 11/1996 |
| JP | 10-12788 | 1/1998 |
| JP | 10-144853 | 5/1998 |
| JP | 10-321768 | 12/1998 |
| JP | 11-45964 | 2/1999 |
| JP | 11-74439 | 3/1999 |
| JP | 2000-68430 | 3/2000 |
| JP | 2000-307017 | 11/2000 |
| JP | 2001-196518 | 7/2001 |
| JP | 2002-50729 | 2/2002 |
| JP | 2002-270736 | 9/2002 |
| JP | 2002-280509 | 9/2002 |

\* cited by examiner

SEMICONDUCTOR DEVICE

This is a continuation-in-part of U.S. application Ser. No.: 10/813,008, filed Mar. 31, 2004, now abandoned the subject matter of which is incorporated herein by reference.

BACKGROUND OF THE INVENTION

1. Field of the Invention

The present invention relates to a semiconductor device comprising a semiconductor chip encapsulated with a mold resin, and more particularly to a semiconductor device comprising a semiconductor chip generating a large quantity of heat, encapsulated with a mold resin.

2. Description of Related Art

Because a semiconductor chip is encapsulated with a mold resin (an encapsulating resin) in a semiconductor device, heat generated in the semiconductor chip readily resides within the semiconductor device (a mold resin). It is therefore necessary for a semiconductor device provided with a semiconductor chip that generates a large quantity of heat while it is driven to efficiently dissipate heat generated in the semiconductor chip to the outside of the semiconductor device.

For example, Japanese Unexamined Patent Publication No. 60-160639(1985) has disclosed a semiconductor device, in which a lead frame joined to one surface of the semiconductor chip is exposed through a mold resin in the vicinity of the joint to the semiconductor chip. With this semiconductor device, heat generated in the semiconductor chip is chiefly dissipated to the outside via the exposed portion of the lead frame through the mold resin.

Also, Japanese Unexamined Patent Publication No. 8-298302(1996) and Japanese Unexamined Patent Publication No. 10-321768(1998) have disclosed a semiconductor device, in which a heat-spreading plate or a heat-spreading body joined to one surface of the semiconductor chip instead of the lead frame is exposed to the outside of a mold resin. With this semiconductor device, heat generated in the semiconductor chip is chiefly dissipated to the outside via the exposed portion of the heat-spreading plate or heat-spreading body through the mold resin.

Further, there is known a semiconductor device, in which the semiconductor chip is directly exposed through the mold resin. This semiconductor device is shaped like a rectangular prism, and the semiconductor chip is exposed through the center of one surface of the semiconductor device. Heat generated in the semiconductor chip is thus directly dissipated to the outside of the semiconductor device. This semiconductor device is mounted on a wiring board in an orientation such that the surface from which the semiconductor chip is exposed opposes the wiring board.

In the case of the semiconductor chip generating a large quantity of heat, however, the semiconductor device having the structure described above is not able to dissipate heat generated in the semiconductor chip in a satisfactory manner, and there has been a need for a semiconductor device with an enhanced heat-spreading capability.

In addition, a semiconductor device in which the semiconductor chip is exposed directly through the mold resin has a problem that the semiconductor chip readily breaks. Further, in a case where the exposed semiconductor chip is joined to the wiring board through soldering or the like in such a semiconductor device, because the joint is hidden in a space between the semiconductor device and the wiring board, direct visual inspection of the joint is impossible, which makes it difficult to confirm whether the two components are joined to each other in a satisfactory manner.

SUMMARY OF THE INVENTION

An object of the invention is therefore to provide a semiconductor device capable of enhancing the heat-spreading capability.

Another object of the invention is to provide a semiconductor device enabling a joint state to the wiring board to be readily confirmed when joined to the wiring board.

A semiconductor device of the invention is a semiconductor device having a bottom surface and mountable on a wiring board with the bottom surface being opposed to the wiring board. The semiconductor device includes: a semiconductor chip; a mold resin encapsulating the semiconductor chip; a first heat spreader joined to the semiconductor chip on the bottom surface side with respect to the semiconductor chip, and extending in substantially parallel with the bottom surface with both ends thereof protruding from an edge of the mold resin when viewed in a direction perpendicular to the bottom surface, the first heat spreader being capable of being joined to the wiring board by means of the both ends thereof, the bottom surface side of the first heat spreader being substantially entirely covered with the mold resin; and a second heat spreader joined to the semiconductor chip on a top surface side opposite to the bottom surface with respect to the semiconductor chip, and extending in substantially parallel with the bottom surface to cross with the first heat spreader with both ends thereof protruding from the edge of the mold resin when viewed in a direction perpendicular to the bottom surface, the second heat spreader being capable of being joined to the wiring board by means of the both ends, the top surface side of the second heat spreader being substantially entirely covered with the mold resin. The semiconductor device is arranged in such a manner that one of the first and second heat spreaders is a lead frame electrically connected to the semiconductor chip, and that heat generated in the semiconductor chip is dissipated via the first heat spreader and the second heat spreader.

According to the invention, the semiconductor chip is provided between the first and second heat spreaders, and heat generated in the semiconductor chip is thereby dissipated via the first and second heat spreaders. In a case where the lead frame, a heat-spreading plate, or a heat-spreading body is joined to only one surface of the semiconductor chip as in the conventional semiconductor device, heat generated in the semiconductor chip is dissipated from substantially one side with respect to the semiconductor chip.

In contrast, according to the semiconductor device of the invention, heat generated in the semiconductor chip is dissipated in two directions (from the bottom surface side and the top surface side of the semiconductor device) with respect to the semiconductor chip, along which the first and second heat spreaders are provided, respectively. Further, because the first and second heat spreaders cross with each other, heat transmitted to the first and second heat spreaders is dissipated as it is transmitted in two directions along each length direction of the first and second heat spreaders, that is, in four directions with respect to the semiconductor chip when viewed in a direction perpendicular to the bottom surface. This semiconductor device therefore has the higher heat-spreading capability than the conventional semiconductor device.

Also, by covering the bottom surface side of the first heat spreader with the mold resin substantially entirely, it is possible to avoid the first heat spreader from being connected to wirings that should not be electrically connected to the first heat spreader on the bottom surface side of the semiconductor device. It is thus possible to provide, for example, wirings (a via conductor may be included) that should not be electrically connected to the first heat spreader in a region on a mounting board where the semiconductor device is to be mounted.

Further, by covering the top surface side of the second heat spreader with the mold resin substantially entirely, it is possible to avoid a trouble caused by a physical contact with the top surface while the semiconductor device or the peripheral portions are handled (for example, an electrical short circuit (short) occurring when a wiring member forming the electric circuit including the semiconductor device comes into contact with the top surface or an electric shock occurring when the technical person touches the top surface by hand).

It is preferable that the first and second heat spreaders have a large area, and for example, it may be arranged in such a manner that the semiconductor chip falls within an intersection between the first and second heat spreaders completely when viewed in a direction perpendicular to the bottom surface. In this case, the heat-spreading capability can be enhanced further.

Also, because the semiconductor device can be joined to the wiring board by means of the both ends of the first and second heat spreaders, the joint strength with respect to the wiring board can be increased.

Further, because the both ends of the first and second heat spreaders protrude from the edge of the mold resin when viewed in a direction perpendicular to the bottom surface, direct visual inspection of the joints of the semiconductor device (the both ends of the first and second heat spreaders) to the wiring board becomes possible. The joint state of the semiconductor device to the wiring board can be thus readily confirmed.

The semiconductor chip may be electrically connected to the wiring board via one of the first and second heat spreaders that is in effect a lead frame.

Both of the first and second heat spreaders may be lead frames electrically connected to the semiconductor chip.

According to this arrangement, the semiconductor chip can be electrically connected to the wiring board via the first and second heat spreaders.

The semiconductor chip may be provided with a field effect transistor having a source electrode and a drain electrode. In this case, the drain electrode may be electrically connected to the first heat spreader, and the source electrode may be electrically connected to the second heat spreader.

In the case of a semiconductor chip provided with a field effect transistor (FET), the semiconductor chip generates heat when a current flows between the source electrode and the drain electrode. According to the arrangement of the invention, heat generated in the FET can be dissipated to the outside of the semiconductor device in a satisfactory manner. The FET may be, for example, a MOS FET (Metal-Oxide-Semiconductor Field Effect Transistor).

The semiconductor chip may be connected wirelessly to one of the first and second heat spreaders. "To be connected wirelessly" referred to herein is defined as a state where the semiconductor chip is provided in close proximity to the lead frame and joined thereto not through a bonding wire, such as a gold line, but through the use of a joining material (for example, soldering).

According to this arrangement, the semiconductor chip and the first or second heat spreader are provided in close proximity and electrically connected to each other not through a bonding wire but through the use of a joining material, such as soldering; moreover, they are mechanically connected to each other as well. Heat generated in the semiconductor chip is thus transmitted efficiently to the first or second heat spreader via the wirelessly connected portion. This semiconductor device therefore has a high heat-spreading capability.

In this case, by using sufficiently large first and second heat spreaders, not only can the heat-spreading capability be enhanced, but also the joint strength between the semiconductor chip and the first or second heat spreader can be increased.

In a case where both of the first and second heat spreaders are lead frames electrically connected to the semiconductor chip, it is preferable that the semiconductor chip is connected wirelessly to both of the first and second heat spreaders. In this case, heat generated in the semiconductor chip is transmitted to both of the first and second heat spreaders in a satisfactory manner, and the semiconductor device arranged in this manner therefore has a high heat-spreading capability.

The second heat spreader may be joined to the wiring board while being electrically isolated therefrom. In other words, the second heat spreader may not contribute to electrical connection between the semiconductor chip and the wiring board. In this case, the semiconductor chip is electrically connected to the wiring board via the first heat spreader, while heat generated in the semiconductor chip is dissipated to the outside of the semiconductor device via the first and second heat spreaders.

The second heat spreader may have a heat-spreading portion exposed through the mold resin on the top surface side of the semiconductor device.

According to this arrangement, heat generated in the semiconductor chip can be dissipated to the outside of the semiconductor device through a short distance via the heat-spreading portion.

The semiconductor device may further include a third heat spreader joined to the second heat spreader and exposed through the mold resin.

According to this arrangement, heat generated in the semiconductor chip can be dissipated efficiently to the outside of the semiconductor device via the third heat spreader exposed through the mold resin. It is preferable that the exposed area of the third heat spreader is large. The third heat spreader may be provided with, for example, a plurality of plate-shaped portions (fins).

The above and other objects, features, and advantages of the invention will become more apparent from the following description of embodiments with reference to the accompanying drawings.

DESCRIPTION OF THE PREFERRED EMBODIMENTS

Figure 1:
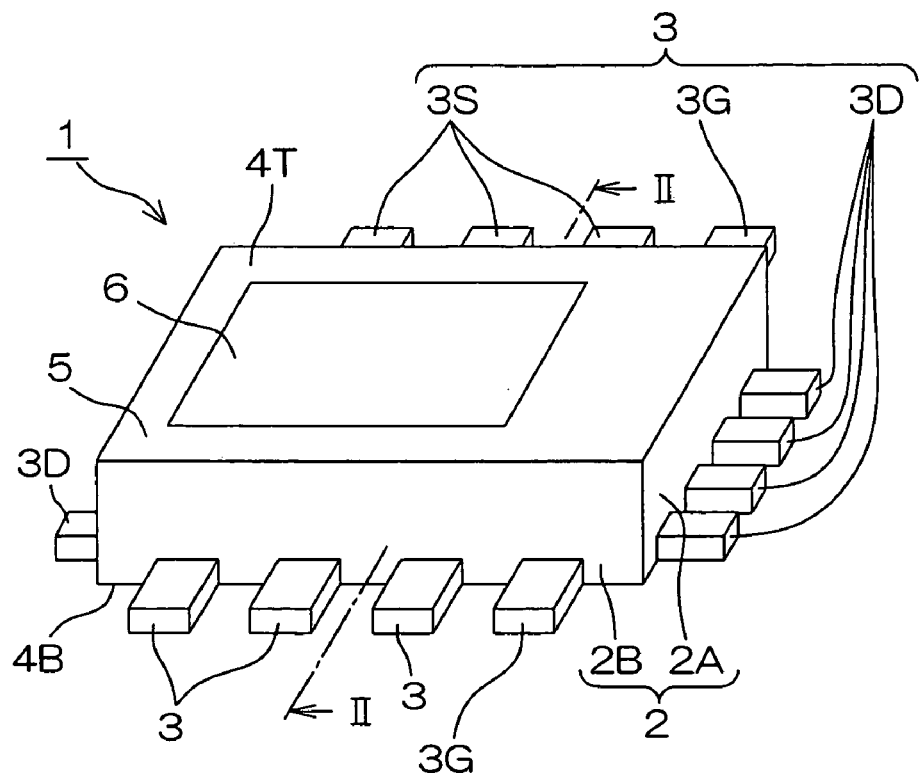
FIG. 1 is a schematic perspective view showing the structure of a semiconductor device.

FIG. 1 is a schematic perspective view showing the structure of a semiconductor device.

The semiconductor device 1 encloses a semiconductor chip provided with a MOS field effect transistor (MOS FET), and is shaped like a flat, rectangular prism by a mold resin 5 encapsulating the semiconductor chip. Plural lead frames 3 (four of them in this embodiment) made of metal protrude from the mold resin 5 on respective side surfaces 2 of the semiconductor device 1 (surfaces parallel to the thickness direction of the semiconductor device 1). Also, a heat-spreading portion 6 made of metal is exposed through the mold resin 5 at the center of the surface 4T, which is one of a pair of surfaces perpendicular to the thickness direction of the semiconductor device 1 (hereinafter, referred to as the top surface). The exposed portion of the heat-spreading portion 6 through the mold resin 5 is made into a flat plane, which is almost flush with the surface of the mold resin 5.

Of the two pairs of side surfaces 2 of the semiconductor device 1 with each pair comprising the side surfaces 2 parallel to each other, the protrusions of the lead frames 3 from one pair of side surfaces 2A form drain terminals 3D. Also, the protrusions of the lead frames 3 from the other pair of side surfaces 2B of the semiconductor device 1 form source terminals 3S and gate terminals 3G. The gate terminals 3G are adjacent to one of the pair of side surfaces 2A.

The drain terminals 3D, the source terminals 3S, and the gate thermals 3G are all provided to the surface 4B side of the semiconductor device 1 on the side opposite to the top surface 4T (hereinafter, referred to as the bottom surface). The surfaces of the drain terminals 3D, the source terminals 3S, and the gate terminals 3G on the bottom surface 4B side are almost flush with the bottom surface 4B of the semiconductor device 1.

Figure 2:
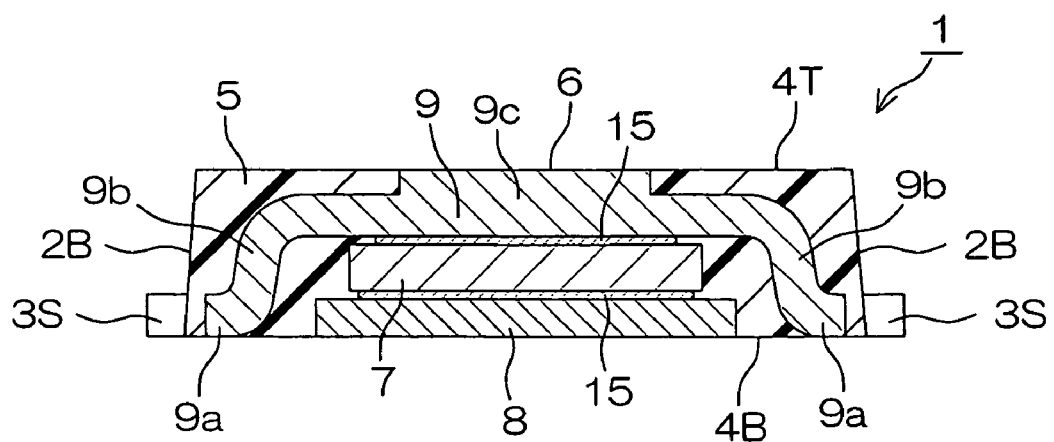
FIG. 2 is a schematic cross section of the semiconductor device shown in FIG. 1.
Figure 3:
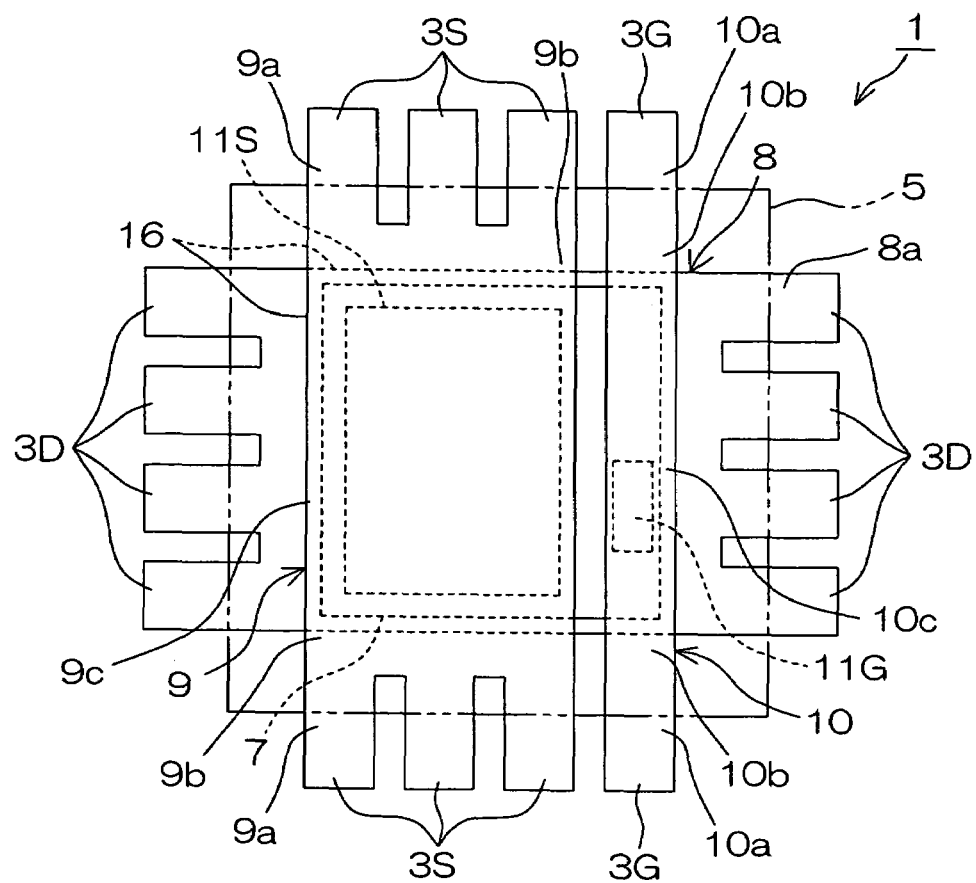
FIG. 3 is a schematic plan view of the semiconductor device shown in FIG. 1 when the top surface is viewed in a direction perpendicular to the bottom surface.

FIG. 2 is a schematic cross section of the semiconductor device 1 taken along the section line II—II shown in FIG. 1. FIG. 3 is a schematic plan view of the semiconductor device 1 when the top surface 4T is viewed in a direction perpendicular to the bottom surface 4B. The mold resin 5 is omitted from FIG. 3, and the edge of the mold resin 5 is indicated by a chain double-dashed line.

The lead frames 3 include plate-shaped first through third lead frames 8, 9, and 10 extending in substantially parallel with the bottom surface 4B. The first lead frame 8, the second lead frame 9, and the third lead frame 10 extend in directions such that the first lead frame 8 and the last two lead frames 9, 10 are orthogonal to each other and thereby cross with one another. The first lead frame 8 is wider than the second and third lead frames 9 and 10, and the second lead frame 9 is wider than the third lead frame 10.

The both ends 8a, 9a, and 10a of the first through third lead frames 8, 9, and 10, respectively, protrude from the edge of the mold resin 5 when viewed in a direction perpendicular to the bottom surface 4B (see FIG. 3).

The first lead frame 8 is of a tabular shape such that can be placed on substantially a single plane, and extends in a direction perpendicular to the sheet surface of FIG. 2. The first lead frame 8 is exposed from the bottom surface 4B. The both ends 8a of the first lead frame 8 in its length direction are made into the shape of a comb, and the ends of these comb-shaped portions protrude from the edge of the mold resin and form the drain terminals 3D (see FIG. 1). The base ends of the comb-shaped portions reside within the mold resin 5. This structure makes the first lead frame 8 difficult to fall off from the mold resin 5.

The second and the third lead frames 9 and 10 respectively include: both ends 9a and 10a placed on substantially the same plane as the first lead frame 8; intermediate portions 9c and 10c provided along a plane spaced apart from the above-specified plane by a certain distance; and rising portions 9b and 10b between the both ends 9a and 10a and the intermediate portions 9c and 10c, respectively. The intermediate portions 9c and 10c avoid the interference between the first lead frame 8 and the second and third lead frames 9 and 10.

The both ends 9a of the second lead frame 9 are made into the shape of a comb, and the ends of these comb-shaped portions protrude from the edge of the mold resin 5 and form the source terminals 3S (see FIG. 1). The base ends of these comb-shaped portions reside within the mold resin 5. This structure makes the second and third lead frames 9 and 10 difficult to fall off from the mold resin 5.

The both ends 10a of the third lead frame 10 protrude from the edge of the mold resin 5 and form the gate terminals 3G.

The intermediate portion 9c of the second lead frame 9 in the vicinity of the semiconductor chip 7 is made thicker so as to protrude in the direction opposite to the semiconductor chip 7, and forms the heat-spreading portion 6 exposed through the mold resin 5 on the top surface 4T of the semiconductor device 1. In other words, the heat-spreading portion 6 forms part of the second lead frame 9.

The semiconductor chip 7 is provided in a space between the first lead frame 8 and the intermediate portions 9c and 10c of the second and third lead frames 9 and 10 in reference to the thickness direction of the semiconductor device 1. The semiconductor chip 7 is shaped like a plate, and the thickness direction of the semiconductor chip 7 and the thickness direction of the semiconductor device 1 agree with each other. The semiconductor chip 7 is provided in close proximity to the first through third lead frames 8, 9, and 10, and joined thereto not through a bonding wire but through soldering 15. In short, the semiconductor chip 7 is connected wirelessly to the first through third lead frames 8, 9, and 10.

The rising portions 9b are provided in such a way as to pass by the vicinity of the side surfaces of the semiconductor chip 7 within the mold resin 5.

When viewed in a direction perpendicular to the bottom surface 4B, the semiconductor chip 7 is slightly smaller than a region 16 (hereinafter, referred to as the overlap region) where the locations of the first lead frame 8, and second and third lead frames 9 and 10 overlap (cross with each other), but has almost the same area as the overlap region 16 (see FIG. 3). The entire semiconductor chip 7 is provided within the overlap region 16, and the semiconductor chip 7 overlaps the first through third lead frames 8, 9, and 10 in a large area.

Figure 4:
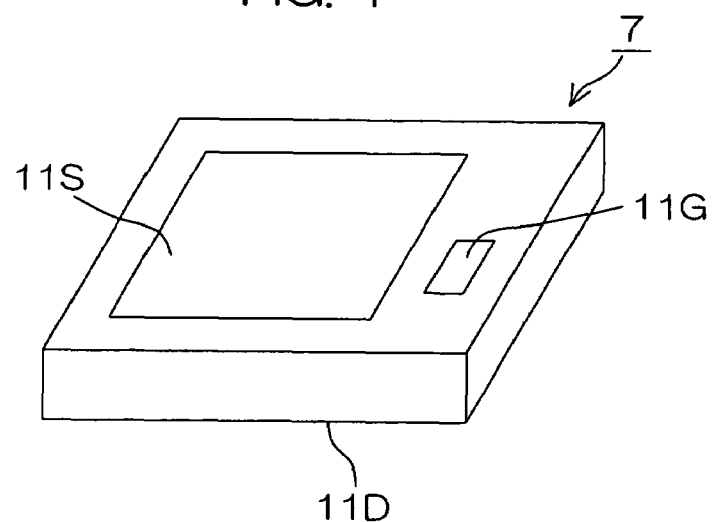
FIG. 4 is a schematic perspective view showing the structure of a semiconductor chip.

FIG. 4 is a schematic perspective view showing the structure of the semiconductor chip 7.

A source electrode 11S and a gate electrode 11G are formed on one surface of the semiconductor chip 7. The area of the gate electrode 11G is smaller than the area of the source electrode 11S. The gate electrode 11G is provided in the vicinity of one side of the semiconductor chip 7 when viewed in a plane looking down the semiconductor chip 7 in the thickness direction thereof. On the other hand, the source electrode 11S is formed in a region avoiding the vicinity of the above-specified side of the semiconductor chip 7.

A drain electrode 11D is formed on the other surface of the semiconductor chip 7.

Referring to FIG. 3, when viewed in a direction perpendicular to the bottom surface 4B, the entire source electrode 11S is positioned within the region where the second lead frame 9 is present, whereas the source electrode 11S does not overlap the third lead frame 10. The semiconductor chip 7 is connected wirelessly to the second lead frame 9 via the source electrode 11S, and the source electrode 11S and the second lead frame 9 are not only electrically connected, but also mechanically joined to each other.

Likewise, when viewed in a direction perpendicular to the bottom surface 4B, the entire gate electrode 11G is positioned within the region where the third lead frame 10 is present, whereas the gate electrode 11G does not overlap the second lead frame 9. The semiconductor chip 7 is connected wirelessly to the third lead frame 10 via the gate electrode 11G, and the gate electrode 11G and the third lead frame 10 are not only electrically connected, but also mechanically joined to each other.

Figure 5:
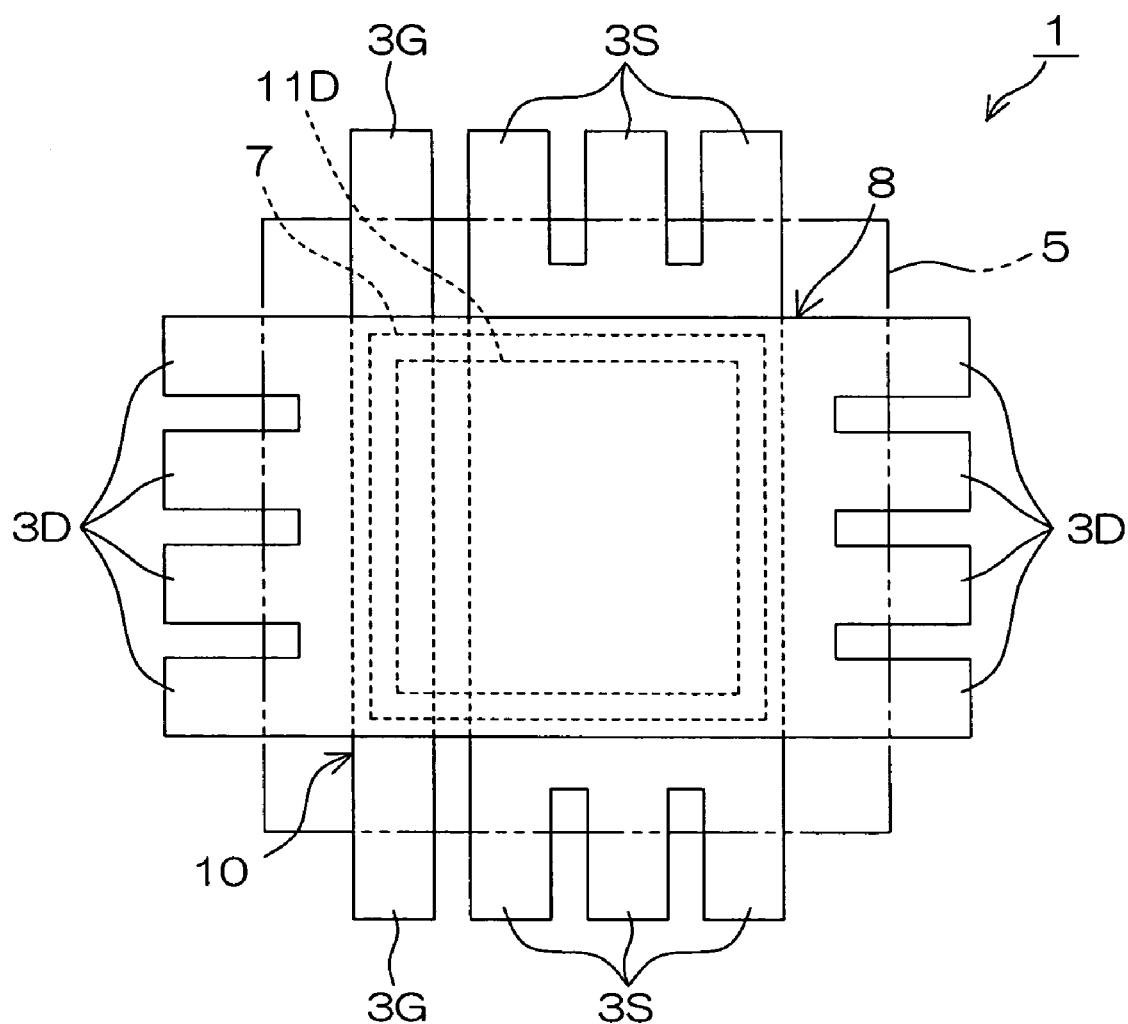
FIG. 5 is a schematic bottom view of the semiconductor device shown in FIG. 1.

FIG. 5 is a schematic bottom view of the semiconductor device 1, and shows a state when the bottom surface 4B is viewed in a direction perpendicular to the bottom surface 4B. The mold resin 5 is omitted from FIG. 5, and the edge of the mold resin 5 is indicated by a chain double-dashed line.

The drain electrode 11D is formed at the center of the semiconductor chip 7, and the drain electrode 11D has a large area, which is almost as large as (slightly smaller than) the area occupied by the semiconductor chip 7. The semiconductor chip 7 is connected wirelessly to the first lead frame 8 via the drain electrode 11D, and the drain electrode 11D and the first lead frame 8 are not only electrically connected, but also mechanically joined to each other. Because the drain electrode 11D has a large area, a larger joint area is secured for the semiconductor chip 7 and the first lead frame 8.

As has been described, the semiconductor chip 7 is sandwiched by the first through third lead frames 8, 9, and 10 from the both sides (in two directions) in reference to the thickness direction of the semiconductor chip 7, and the joint area to the first through third lead frames 8, 9, and 10 becomes larger. This increases the joint strength between the semiconductor chip 7 and the lead frames 3.

Figure 6:
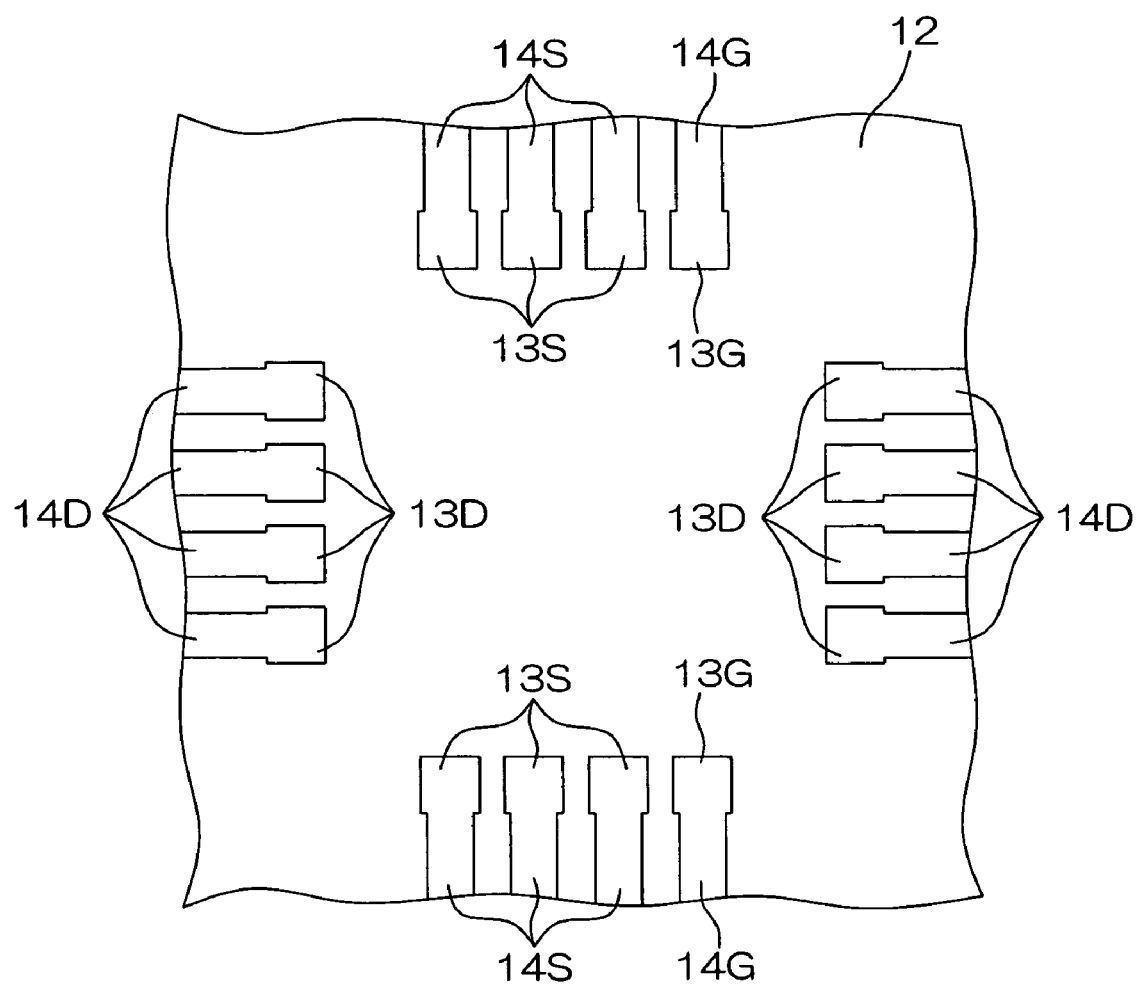
FIG. 6 is a schematic plan view of a wiring board on which the semiconductor device shown in FIG. 1 is mounted.

FIG. 6 is a schematic plan view of a wiring board on which the semiconductor device 1 is mounted.

In the wiring board 12 are formed electrode pads 13D, 13S, and 13G at positions corresponding to the drain terminals 3D, the source terminals 3S, and the gate terminals 3G, respectively. Wirings 14D, 14S and 14G extend from the electrode pads 13D, 13S, and 13G, respectively.

Referring to FIG. 5 and FIG. 6, the semiconductor device 1 can be mounted on the wiring board 12 with the bottom surface 4B being opposed to the wiring board 12. In this instance, the drain terminals 3D, the source terminals 3S, and the gate terminals 3G of the semiconductor device 1 can be joined to the electrode pads 13D, 13S, and 13G of the wiring board 12, respectively, through soldering or the like.

The semiconductor device 1 can be joined to the wiring board 12 in a large joint area by means of the drain terminals 3D, the source terminals 3S, and the gate terminals 3G protruding from the four side surfaces 2. It is thus possible to join the semiconductor device 1 to the wiring board 12 with a high joint strength.

The wiring board 12 may be provided with a joining pad at a position corresponding to the bottom surface 4B of the semiconductor device 1. By joining the joining pad to the first lead frame 8 exposed to the bottom surface 4B through soldering or the like, the joint area of the semiconductor device 1 and the wiring board 12 can be further increased, which in turn increases the joint strength further.

Because the drain terminals 3D, the source terminals 3S, and the gate terminals 3G protrude from the side surfaces 2 of the semiconductor device 1, direct visual inspection of the joints of the drain terminals 3D, the source terminals 3S, and the gate terminals 3G to the wiring board 12 (electrode pads 13D, 13S, and 13G) becomes possible. Hence, when the semiconductor device 1 is joined to the wiring board 12, the joint state to the wiring board 12 can be readily confirmed.

Even in a case where the both ends of the lead frame 8 do not protrude from the side surfaces 2A, that is, in a case where the both ends of the first lead frame 8 do not protrude from the edge of the mold resin 5 when viewed in a direction perpendicular to the bottom surface 4B, the exposed portion of the first lead frame 8 from the bottom surface 4B can be connected to the wiring board 12 as the drain terminal. In this case, an electrode pad can be provided to the wiring board 12 in a region corresponding to the drain terminal.

In this case, however, the joint of the drain terminal (first lead frame 8) and the corresponding electrode pad on the wiring board 12 is hidden in a space between the semiconductor device 1 and the wiring board 12, which makes the direct visual inspection of the joint as in this embodiment impossible. Therefore, in this case, it is not easy to confirm whether the drain terminal (first lead frame 8) is joined to the electrode pad on the wiring board 12 in a satisfactory manner.

The semiconductor chip 7 generates heat when a current flows between the source electrode 11S and the drain electrode 11D. In this instance, the semiconductor chip 7 generates a large quantity of heat. Heat generated in the semiconductor chip 7 is, however, transmitted efficiently to the first through third lead frames 8, 9, and 10 for the reasons as follows: (1) the semiconductor chip 7 overlaps the first through third lead frames 8, 9, and 10 in a large area; and (2) the source electrode 11S, the drain electrode 11D, and the gate electrode 11G are connected wirelessly to the first through third lead frames 8, 9, and 10.

Heat transmitted to the first through third lead frames 8, 9, and 10 is dissipated into air via the drain terminals 3D, the source terminals 3S, and the gate terminals 3G, as well as the wirings 14D, 14S, and 14G extending from the electrode pads 13D, 13S, and 13G to which the drain terminals 3D, the source terminals 3S, and the gate terminals 3G are joined, respectively.

In this manner, heat generated in the semiconductor chip 7 is dissipated as it is transmitted not in a single direction, but in two directions (a direction along which the first lead frame 8 is provided and a direction along which the second and third lead frames 9 and 10 are provided) with respect to the semiconductor chip 7.

Further, heat transmitted to the first lead frame 8 and the second and third lead frames 9 and 10 is dissipated in two directions along the length direction of the first lead frame 8 and in two directions along the length direction of the second and third lead frames 9 and 10, that is, in four directions with respect to the semiconductor chip 7. This enhances the heat-spreading capability of the semiconductor device 1.

Furthermore, heat transmitted to the second lead frame 9 is dissipated into air from the heat-spreading portion 6. Because the heat-spreading portion 6 is formed by making part of the second lead frame 9 thicker, heat generated in the semiconductor chip 7 is dissipated into air through a short distance. This effect also enhances the heat-spreading capability of the semiconductor device 1.

The semiconductor device 1 mounted to the wiring board 12 may be used with a fan being attached to a position at which air can be sent to the semiconductor device 1. By sending air to the semiconductor device 1 (particularly, to the heat-spreading portion 6) by means of the fan, heat generated in the semiconductor chip 7 can be dissipated into air more efficiently.

Figure 7A:
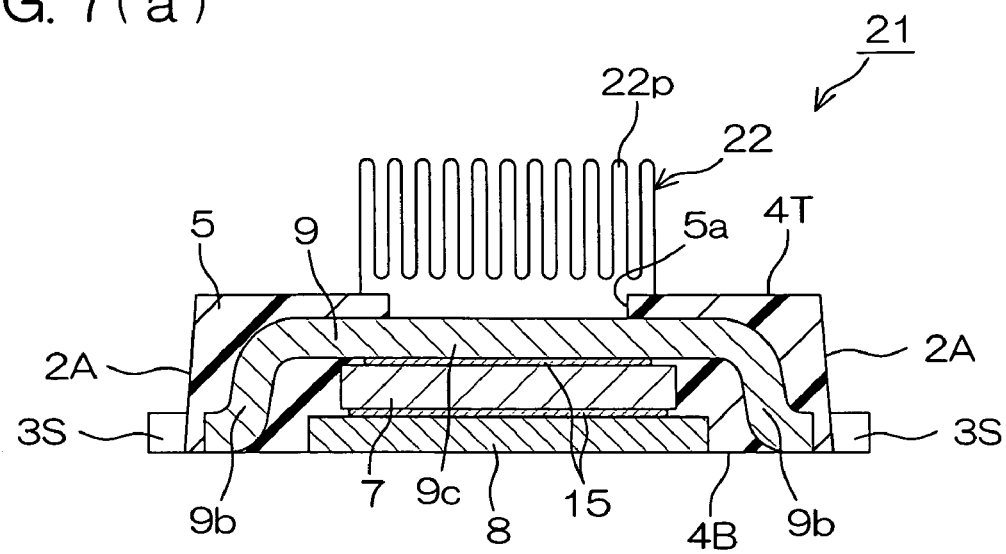
FIG. 7(a) and FIG. 7(b) are schematic cross section and plan view, respectively, showing the structure of another semiconductor device.
Figure 7B:
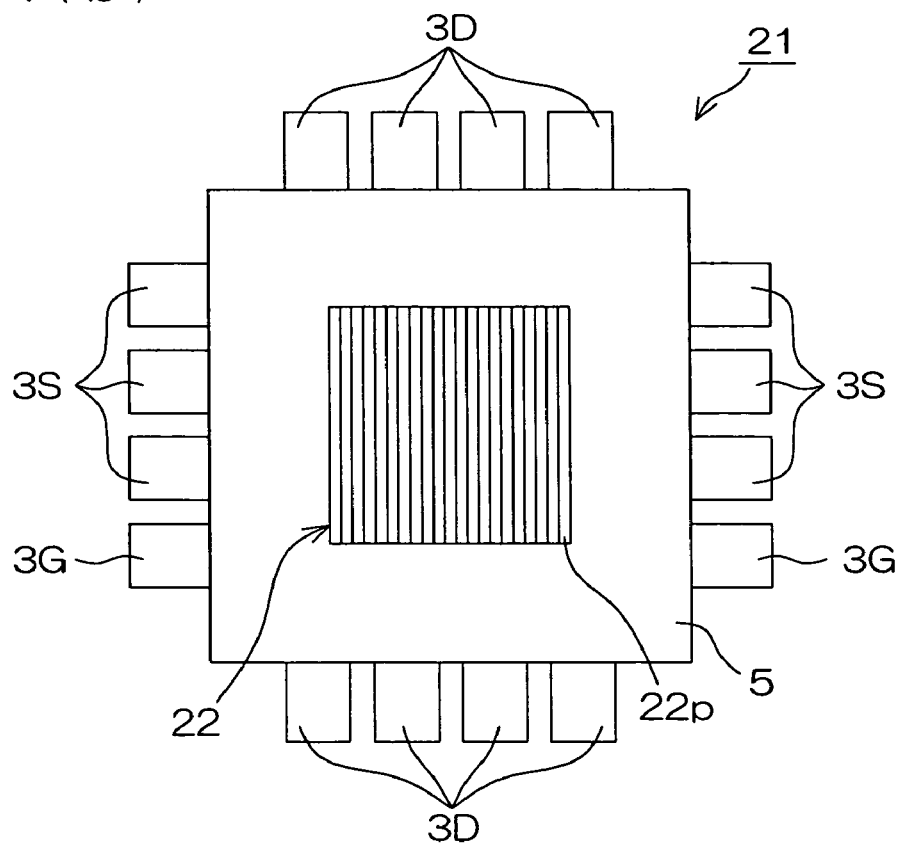

FIG. 7(a) is a schematic cross section showing the structure of another semiconductor device, and FIG. 7(b) is a schematic plan view thereof. Components corresponding to those shown in FIG. 1 through FIG. 3 are labeled with the same reference characters in FIG. 7(a) and FIG. 7(b), and the description of these components is omitted.

The second lead frame 9 of the semiconductor device 21 has no heat-spreading portion 6, and has a constant thickness. The mold resin 5 is provided with an opening 5a at the center of the top surface 4T of the semiconductor device 21. Inside the opening 5a appears a portion of the second lead frame 9 in the vicinity of the semiconductor chip 7.

A heat spreader 22 is fit into the opening 5a. The heat spreader 22 is joined to the second lead frame 9 through soldering, silver paste, etc.

The heat spreader 22 may pinch or may be pinched with the second lead frame 9 or the mold resin 5. In other words, the heat spreader 22 may come into direct contact with the second lead frame 9 without soldering, silver paste, etc.

In this case, for example, the second lead frame 9 and the heat spreader 22 may be pinched together. To be more specific, part of the second lead frame 9 may be bent to come around above the heat spreader 22 (in a direction opposite to the second lead frame 9) so as to sandwich the heat spreader 22. Alternatively, the end of the heat spreader 22 may come around and extend beneath the second lead frame 9 (in a direction opposite to the heat spreader 22) so as to sandwich the second lead frame 9. In any of these cases, the mold resin 5 is formed after the second lead frame 9 and the heat-spreading portion 22 are pinched together.

The heat spreader 22 is made of metal, and is provided with a number of plate-shaped fins 22p, which are substantially parallel to the thickness direction of the semiconductor device 21 while being parallel to one another. The fins 22p are exposed to the outside of the mold resin 5. This increases the exposed area of the heat spreader 22 in comparison with the exposed area of the heat-spreading portion 6 of the semiconductor device 1 shown in FIG. 1, and thereby allowing the heat spreader 22 to come into contact with air in a larger area.

In the semiconductor device 21 having the structure described above, heat generated in the semiconductor chip 7 is dissipated efficiently not only via the first through third lead frames 8, 9, and 10, but also via the heat spreader 22. Because the exposed area of the heat spreader 22 is large, the semiconductor device 21 has the higher heat-spreading capability than the semiconductor device 1 shown in FIG. 1.

The heat spreader 22 is not limited to the one having the fins 22p as shown in FIG. 7(a) and FIG. 7(b), and can be used in various forms as follows.

Figure 8A:
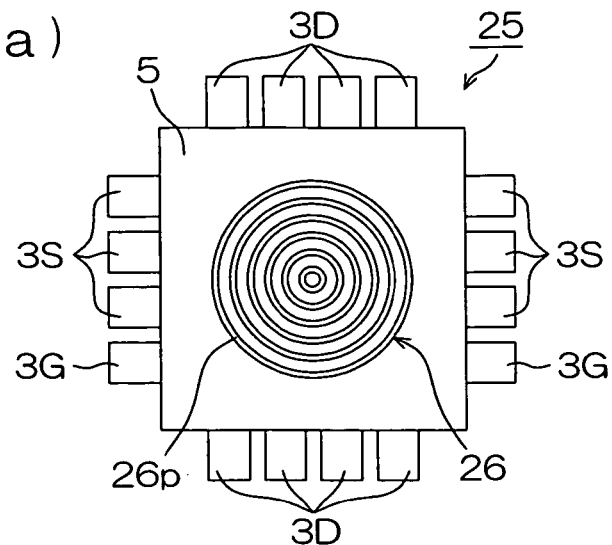
FIG. 8(a), FIG. 8(b), and FIG. 8(c) are schematic plan views showing the structures of other semiconductor devices.
Figure 8B:
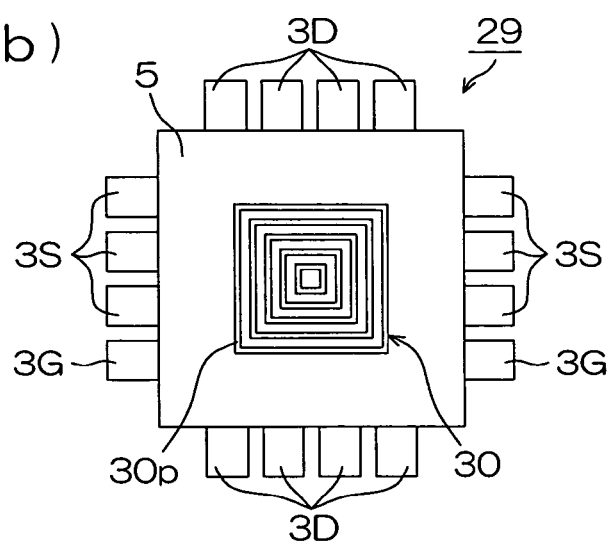
Figure 8C:
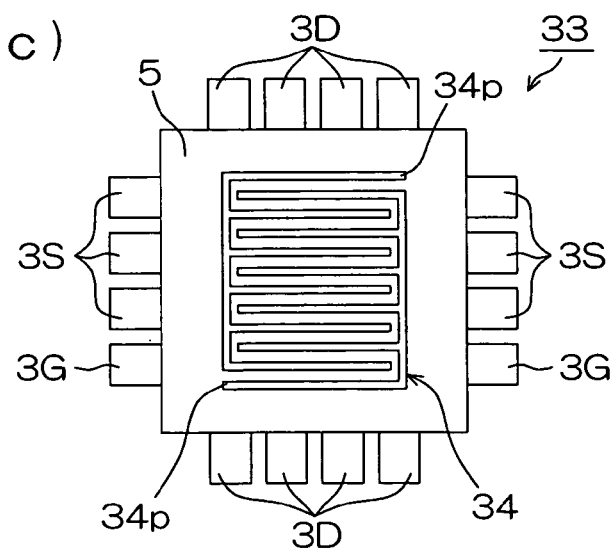

FIG. 8(a) through FIG. 8(c) are schematic plan views showing the structures of three other semiconductor devices. Components corresponding to the components of the semiconductor device 21 shown in FIG. 7(a) and FIG. 7(b) are labeled with the same reference characters in FIG. 8(a) through FIG. 8(c), and the description of these components is omitted.

The semiconductor device 25 of the third embodiment shown in FIG. 8(a) is of a structure similar to that of the semiconductor device 21 shown in FIG. 7(a) and FIG. 7(b); however, they are different in structure of the heat spreader. The heat spreader 26 provided to the semiconductor device 25 is made of metal, and includes a number of coaxially aligned, cylindrical portions 26p having different diameters. The cylindrical portions 26p are exposed through the mold resin 5.

The semiconductor device 29 of the fourth embodiment shown in FIG. 8(b) is of a structure similar to that of the semiconductor device 25 shown in FIG. 8(a); however, they are different in structure of the heat spreader. The heat spreader 30 provided to the semiconductor device 29 is made of metal, and includes a number of coaxially aligned, tubular portions 30p of a rectangular shape (almost square in this embodiment) when viewed in a plane. The tubular portions 30p are exposed through the mold resin 5.

The semiconductor device 33 of the fifth embodiment shown in FIG. 8(c) is of a structure similar to that of the semiconductor device 21 shown in FIG. 7(a) and FIG. 7(b); however, they are different in structure of the heat spreader. The heat spreader 34 provided to the semiconductor device 33 is made of metal, and includes a pair of comb-shaped portions 34p provided so as to be fit together with a slight clearance in between. The come-shaped portions 34p are exposed through the mold resin 5.

Any of the heat spreaders 26, 30, and 34 has a larger exposed area than the heat-spreading portion 6 (see FIG. 1), which enhances the heat-spreading capability of the semiconductor devices 25, 29, and 33 in comparison with the heat-spreading capability of the semiconductor device 1.

Figure 9A:
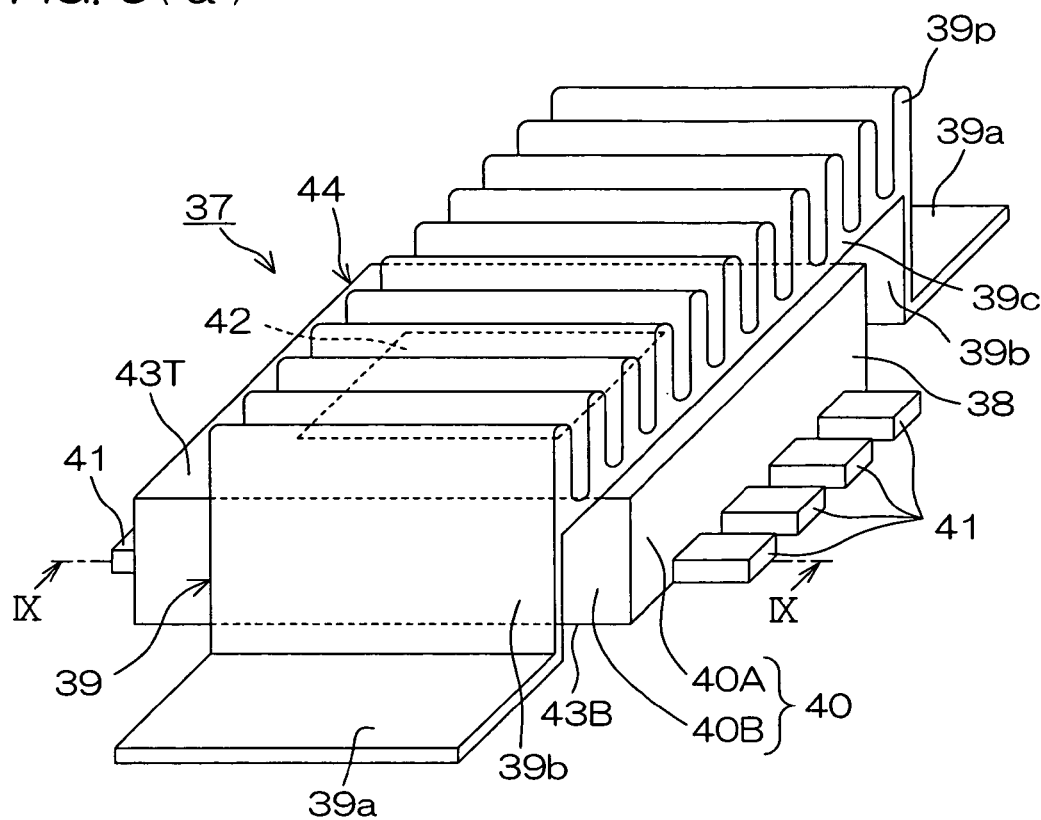
FIG. 9(a) and FIG. 9(b) are schematic perspective view and cross section, respectively, showing the structure of still another semiconductor device.
Figure 9B:
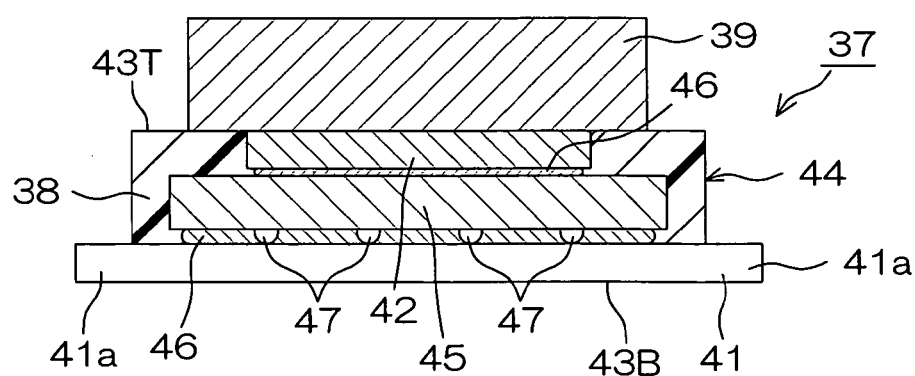

FIG. 9(a) is a schematic perspective view showing the structure of still another semiconductor device. FIG. 9(b) is s schematic cross section taken along the section line IX—IX of FIG. 9(a).

The semiconductor device 37 includes a main body 44 that encloses a semiconductor chip 45 shaped like a rectangular prism and provided with an LSI (Large Scale Integrated circuit) and is molded into a flat, almost rectangular prism by a mold resin 38, and a heat spreader 39 (not shown in FIG. 9(b)) attached to cover the main body 44.

A heat-transmitting member 42 is joined to one surface of the semiconductor chip 45 through soldering 46. The heat-transmitting member 42 is exposed through the mold resin 38 at the center of the surface 43T, which is one of a pair of surfaces orthogonal to the thickness direction of the main body 44 (hereinafter, referred to as the top surface). The top surface 43T of the main body 44 is almost flush with the exposed surface of the heat-transmitting member 42.

Of the four side surfaces 40 (surfaces parallel to the thickness direction of the main body 44) of the mold resin 38, plural lead frames 41 (four of them in this embodiment) protrude from a pair of side surfaces 40A parallel to each other. The respective lead frames 41 extend and penetrate through the mold resin 38 in a direction perpendicular to the side surfaces 40A. The lead frames 41 and the heat-transmitting member 42 can be made of, for example, the same material.

The lead frames 41 are provided to the semiconductor chip 45 on the opposite side to the heat-transmitting member 42. In other words, the semiconductor chip 45 is sandwiched between the lead frames 41 and the heat-transmitting member 42. The semiconductor chip 45 is provided with functional elements and leading electrodes thereof on the surface opposing the lead frames 41. On the contrary, none of the functional elements and leading electrodes thereof is formed on the other surface of the semiconductor chip 45.

Bumps 47 are joined to the leading electrodes formed on the semiconductor chip 45, and the surface of the semiconductor chip 45 on which the bumps 47 are formed is connected wirelessly to the lead frames 41 through soldering 46. In short, the semiconductor chip 45 and the lead frames 41 are not only electrically connected, but also mechanically joined to each other through soldering 46.

The lead frames 41 are all provided on the surface 43B side opposite to the top surface 43T (hereinafter, referred to as the bottom surface) in reference to the thickness direction of the main body 44. The surfaces of the lead frames 41 on the bottom surface 43B side are almost flush with the bottom surface 43B. The lead frames 41 are exposed to the bottom surface 43B. The both ends 41a of the lead frames 41 protrude from the edge of the mold resin 38 when viewed in a direction perpendicular to the bottom surface 43B.

The heat spreader 39 extends in substantially parallel with the bottom surface 43B, and extends to cross with the lead frames 41 in a direction almost orthogonal to the lead frames 41 when viewed in a direction perpendicular to the bottom surface 43B. When viewed in a direction perpendicular to the bottom surface 43B, the heat spreader 39 has a width slightly narrower than the width of the main body 44, and the both ends of the heat spreader 39 protrude from the edge of the mold resin 38.

The both ends 39a of the heat spreader 39 are shaped like a plate, and is placed on almost the same plane as the lead frames 41. On the other hand, the intermediate portion 39c of the heat spreader 39 in its length direction is provided along the top surface 43T of the main body 44. The portions between the both ends 39a and the intermediate portion 39c form rising portions 39b provided along a pair of side surfaces 40B, which is another pair of the side surfaces 40 of the main body 44, different from the pair of the side surfaces 40A.

The heat spreader 39 comes in contact with the exposed surface of the heat-transmitting member 42 through the mold resin 38. Hence, heat generated in the semiconductor chip 45 is transmitted to the heat spreader 39 via the heat-transmitting member 42. On the other hand, the heat spreader 39 is not electrically connected to the semiconductor chip 45. In other words, the heat spreader 39 does not contribute to electrical connection of the semiconductor chip 45.

A number of plate-shaped portions (fins) 39p, which are parallel to both the thickness direction of the main body 44 and the length direction of the lead frames 41 and parallel to one another, protrude from the intermediate portion 39c of the heat spreader 39. This increases the surface area of the heat spreader 39.

The wiring board, on which the semiconductor device 37 is mounted, is provided with electrode pads to which wirings are connected, at the positions respectively corresponding to the protrusions of the lead frames 41 from the mold resin 38, and with the joining pads at the positions corresponding to the both ends 39a of the heat spreader 39.

In this case, by having the bottom surface 43B oppose to the wiring board and joining the protrusions of the lead frames 41 from the mold resin 38 to the electrode pads, not only can the semiconductor chip 45 be electrically connected to the electrode pads formed on the wiring board, but also the semiconductor device 37 can be mechanically joined to the wiring board. In addition, by joining the both ends 39a to the joining pads through soldering or the like, the semiconductor device 37 can be mechanically joined to the wiring board. Under these conditions, the surface of the semiconductor chip 45, on which the functional elements are formed, is oriented (faced down) to the wiring board side.

Because the both ends of the lead frames 41 and the both ends 39a of the heat spreader 39 protrude from the edge of the mold resin 38 when viewed in a direction perpendicular to the bottom surface 43B, direct visual inspection of the joints described above becomes possible. The joint state of the semiconductor device 37 to the wiring board can be thus readily confirmed.

The joining pads can be electrically isolated from the wirings on the wiring board. In this case, the heat spreader 39 is joined to the wiring board while being electrically isolated therefrom.

Heat generated in the semiconductor chip 45 is transmitted to the lead frames 41 and the heat-transmitting member 42 (heat spreader 39) provided respectively in two directions (opposite to each other) with respect to the semiconductor chip 45, and the heat transmitted to each component is dissipated into air in two directions along the length direction of the lead frames 41 and in two directions along the length direction of the heat spreader 39, that is, in four directions with respect to the semiconductor chip 45. Because the heat spreader 39 has a large area, heat can be spread efficiently via the heat spreader 39.

The main body 44 and the heat spreader 39 may be formed non-detachably. In this case, the semiconductor device 37 as a whole can be mounted on the wiring board. Alternatively, the main body 44 and the heat spreader 39 may be formed detachably. In this case, the main body 44 may be brought into contact with the heat spreader 39 by mounting the main body 44 on the wiring board first, and thence mounting the heat spreader 39 on the wiring board.

Figure 10:
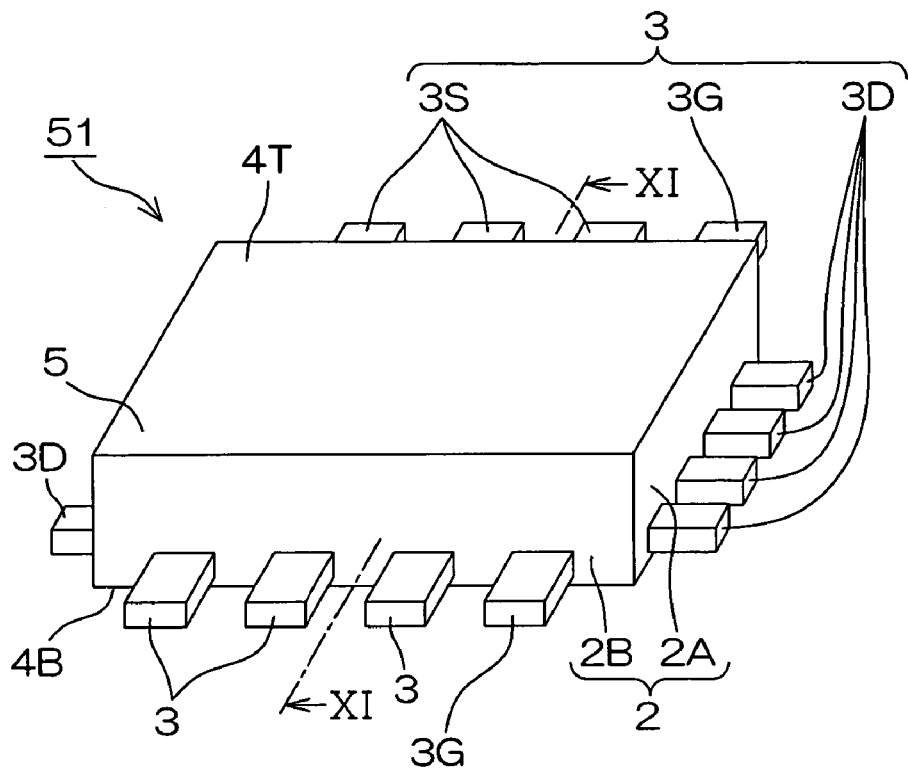
FIG. 10 is a schematic perspective view showing the structure of a semiconductor device according to one embodiment of the invention.
Figure 11:
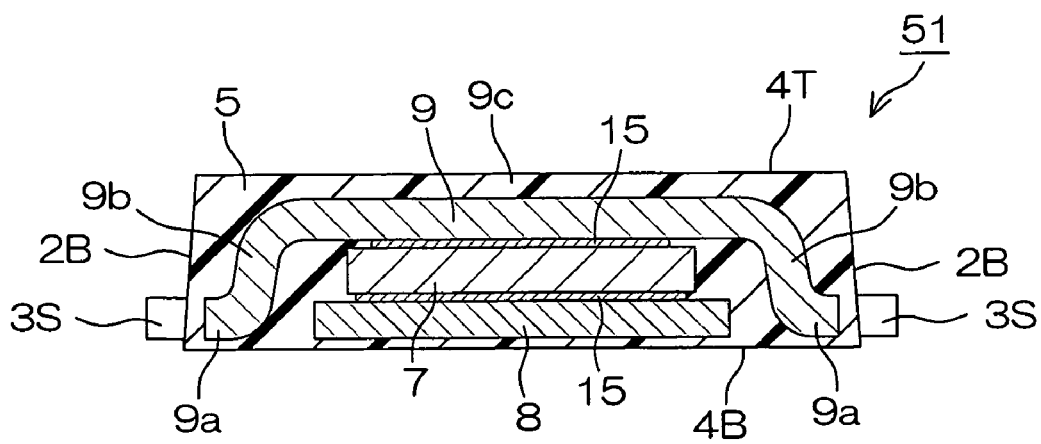
FIG. 11 is a schematic cross section of the semiconductor device shown in FIG. 10.

FIG. 10 is a schematic perspective view showing the structure of a semiconductor device according to one embodiment of the invention. FIG. 11 is a schematic cross section of the semiconductor device taken along the section line XI—XI of FIG. 10. Components corresponding to the components shown in FIG. 10 and FIG. 11 are labeled with the same reference characters in FIG. 1 and FIG. 2, and the description of these components is omitted.

The semiconductor device 51 is different from the semiconductor device 1 shown in FIG. 1 and FIG. 2 in that it does not include the heat spreader 6. In other words, in the semiconductor device 51, the second lead frame 9 does not include the heat spreader 6, and the intermediate portion 9c of the second lead frame 9 has substantially a uniform thickness (the length along a direction perpendicular to the bottom surface 4B).

The top surface 4T side of the second and third lead frames 9 and 10 is substantially entirely covered with the mold resin 5. In other words, the second and third frames 9 and 10 are not exposed through the top surface 4T. The entire top surface 4T of the semiconductor device 51 substantially comprises the surface of the mold resin 5.

The bottom surface 4B side of the first lead frame 8 is substantially entirely covered with the mold resin 5. In other words, the first lead frame 8 is not exposed through the bottom surface 4B. The entire bottom surface 4B of the semiconductor device 51 substantially comprises the surface of the mold resin 5.

By covering the top surface 4T side of the second and third lead frames 9 and 10 with the mold resin 5 substantially entirely, it is possible to avoid a trouble caused by a physical contact with the top surface 4T while the semiconductor device 51 or the peripheral portions are handled (for example, an electrical short circuit (short) occurring when a wiring member forming the electric circuit including the semiconductor device 51 comes into contact with the top surface 4T or an electric shock occurring when the technical person touches the top surface 4T by hand).

By covering the bottom surface 4B side of the first lead frame 8 with the mold resin 5 substantially entirely, it is possible to avoid the first lead frame 8 from being connected to wirings that should not be electrically connected to the first lead frame 8 on the bottom surface 4B side of the semiconductor device 51. It is thus possible to provide, for example, wirings (a via conductor may be included) that should not be electrically connected to the first lead frame 8 in a region on a mounting board where the semiconductor device 51 is to be mounted.

While the embodiments of the invention have been described, it should be appreciated that the invention can be implemented in other embodiments. For example, in the semiconductor device 1 according to the first embodiment above, the third lead frame 10 may extend toward only one side of the semiconductor device 1 when viewed in a direction perpendicular to the bottom surface 43B.

The semiconductor chip 7 is not necessarily connected wirelessly to all the first through third lead frames 8, 9, and 10. For example, the third lead frame 10 may be replaced with a lead frame comprising only a portion equivalent to the both ends 10a, that is, a lead frame having neither the rising portions 10b nor the intermediate portion 10c, so that the replaced lead frame and the gate electrode 11G are connected to each other through a bonding wire.

While the above description described embodiments of the invention in detail, it should be appreciated that these embodiments represent examples to provide clear understanding of the technical contents of the invention, and the invention is not limited to these examples. The sprit and the scope of the invention, therefore, are limited solely by the scope of the appended claims.

This application corresponds to Japanese Patent Application No. 2003-142393 filed with the Japanese Patent Office on May 20, 2003, the entire contents of which are incorporated herein by reference.

What is claimed is:

1. A semiconductor device having a bottom surface and mountable on a wiring board with the bottom surface being opposed to the wiring board, the semiconductor device comprising:

a semiconductor chip;

a mold resin encapsulating the semiconductor chip;

a first heat spreader joined to the semiconductor chip on the bottom surface side with respect to the semiconductor chip, and extending in substantially parallel with the bottom surface with both ends thereof protruding from opposite edges of the mold resin when viewed in a direction perpendicular to the bottom surface, the first heat spreader being capable of being joined to the wiring board by means of the both ends thereof, the bottom surface side of the first head spreader being substantially entirely covered with the mold resin; and a second heat spreader joined to the semiconductor chip on a top surface side opposite to the bottom surface with respect to the semiconductor chip, and extending in substantially parallel with the bottom surface to cross with the first heat spreader along an axis that is non-parallel therewith when viewed in a direction perpendicular to the bottom surface, and with both ends thereof protruding from opposite edges of the mold resin when viewed in a direction perpendicular to the bottom surface, the second heat spreader being capable of being joined to the wiring board by means of the both ends thereof, the top surface side of the second heat spreader being substantially entirely covered with the mold resin, wherein one of the first and second heat spreaders is a lead frame electrically connected to the semiconductor chip.

2. A semiconductor device according to claim 1, wherein:

the semiconductor chip falls within an intersection of the first and second heat spreaders completely when viewed in a direction perpendicular to the bottom surface.

3. A semiconductor device according to claim 1, wherein:

both of the first and second heat spreaders are lead frames electrically connected to the semiconductor chip.

4. A semiconductor device according to claim 3, wherein:

the semiconductor chip is provided with a field effect transistor having a source electrode and a drain electrode, and the drain electrode is electrically connected to the first heat spreader, and the source electrode is electrically connected to the second heat spreader.

5. A semiconductor device according to claim 1, wherein:

the semiconductor chip is connected wirelessly to one of the first and second heat spreaders.

6. A semiconductor device according to claim 1, wherein:

both of the first and second heat spreaders are lead frames electrically connected to the semiconductor chip, and the semiconductor chip is connected wirelessly to both of the first and second heat spreaders.

* * * * *